US006248674B1

(12) United States Patent
Kamins et al.

(10) Patent No.: US 6,248,674 B1
(45) Date of Patent: Jun. 19, 2001

(54) METHOD OF ALIGNING NANOWIRES

(75) Inventors: Theodore I. Kamins, Palo Alto; Ying-Lan Chang, Cupertino, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/496,365

(22) Filed: Feb. 2, 2000

(51) Int. Cl.$^7$ ............................. H01L 21/26; H01L 23/48
(52) U.S. Cl. ............................. 438/798; 257/734
(58) Field of Search ........................ 438/795, 798, 438/618; 257/734, 741; 174/1

(56) References Cited

U.S. PATENT DOCUMENTS

| 5,581,091 | * | 12/1996 | Moskovits et al. . |
| 6,103,540 | * | 8/2000 | Russell et al. . |
| 6,123,819 | * | 9/2000 | Peeters . |
| 6,172,902 | * | 1/2001 | Wegrowe et al. . |
| 6,187,165 | * | 2/2001 | Chien et al. . |

OTHER PUBLICATIONS

Metzger et al., "Magnetic Nanowires in Hexagonally Ordered Pores of Alumina", Jan. 2000, IEEE Transactions on Magnetics, vol. 36, No. 1, pp. 30–35.*

Routkevitch et al., "Nonlithographic Nano-Wire Arrays: Fabrication, Physics, and Device Applications", Oct. 1996, IEEE Transactions on Electron Devices, vol. 43, No. 10, pp. 1646–1658.*

IBM Technical Disclosure Bulletin NN9612235, "Fabrication of Gold Nanostructures by Lithography with Self-Assembled Monolayers", Dec. 1996, vol. 39, Issue No. 12, pp. 235–238.*

C.P. Collier et al, "Electronically Configurable Molecular-Based Logic Gates", Science, vol. 285, pp. 391–394 (Jul. 16, 1999).

J. Westwater et al, "Growth of silicon nanowires via gold/silane vapor-liquid-solid reaction", Journal of Vacuum Science and Technology B, vol. 15, pp. 554–557 (May/Jun. 1997).

A.M. Morales et al, "A Laser Ablation Method for the Synthesis of Crystalline Semiconductor Nanowires", Science, vol. 279, pp. 208–211 (Jan. 9, 1998).

J.L. Liu et al, "Gas-source MBE growth of freestanding Si nano-wires on Au/Si substrate", Superlattices and Microstructures, vol. 25, pp. 477–479 (1999).

Y.F. Ahang et al, "Diameter modification of silicon nanowires by ambient gas", Applied Physics Letters, vol. 75, No. 13, pp. 1842–1844 (Sep. 27, 1999).

Guang Wen Shou et al, "Transmission electron microscopy study of Si nanowires", Applied Physics Letters, vol. 73, No. 5, pp. 677–679 (Aug. 3, 1998).

Y.H. Tankg et al, "Morphology of Si nanowires synthesized by high-temperature laser ablation", Journal of Applied Physics, vol. 85, No. 11, pp. 7981–7983 (Jun. 1, 1999).

D.P. Yu et al, "Nanoscale silicon wires synthesized using simple physical evaporation", Applied Physics Letters, vol. 72, No. 26, pp. 3458–3460 (Jun. 29, 1998).

T.I. Kamins et al, "Chemical vapor deposition of Si nanowires nucleated by TiSi islands on Si", Applied Physics Letters, (Jan. 31, 2000).

\* cited by examiner

*Primary Examiner*—Charles Bowers
*Assistant Examiner*—Evan Pert

(57) ABSTRACT

A method of aligning nanowires on a substrate is provided. First, a plurality of the nanowires is formed on the substrate, then the plurality of nanowires is exposed to a flux of energetic ions, e.g., argon at an ion energy of 5 KV and an integrated flux density of about $6 \times 10^{15}$ ions/cm$^2$. The flux of energetic ions serves to align the nanowires parallel to each other. The flux of energetic ions may also be used to align the nanowires parallel to the substrate surface.

17 Claims, 2 Drawing Sheets

METHOD OF ALIGNING NANOWIRES

CROSS-REFERENCE TO RELATED APPLICATIONS

The present application is related to application Ser. No. 09/280,048, entitled "Chemically Synthesized and Assembled Electronic Devices", filed on Mar. 29, 1999, which is directed to the formation of nanowires used for nanoscale computing and memory circuits. The present application is also related to applications Ser. No. 09/280,225, entitled "Molecular Wire Crossbar Interconnect (MWCI) for Signal Routing and Communications", Ser. No. 09/280,045, entitled "Molecular Wire Crossbar Logic (MWCL)", Ser. No. 09/280,189 (now U.S. Pat. No. 6,128,214 issued Oct. 3, 2000), entitled "Molecular Wire Crossbar Memory", and Ser. No. 09/280,188 (abandoned Nov. 7, 2000), entitled "MOLECLLAR WIRE TRANSISTOR (MWT)", all also filed on Mar. 29, 1999, which are all directed to various aspects of memory and logic circuits utilized in nanocomputing.

This invention was made with Government support under Agreement No. DABT63-99-3-0003 awarded by the Government. The Government has certain rights in the invention.

TECHNICAL FIELD

The present application is generally directed to nanoscale computing and memory circuits, and, more particularly, to the formation of nanowires for device applications, specifically, to the alignment of such nanowires.

BACKGROUND ART

With the constantly decreasing feature sizes of integrated-circuit devices, the need for increasingly fine, lithographically-defined patterning is limiting further advances of the technology. Consequently, a growing amount of effort is being devoted to self-assembly techniques to form switching elements without fine-scale lithography; see, e.g., C. P. Collier et al, "Electronically Configurable Molecular-Based Logic Gates", *Science*, Vol. 285, pp. 391–394 (Jul. 16, 1999). The self-assembled switching elements may be integrated on top of a Si integrated circuit so that they can be driven by conventional Si electronics in the underlying substrate. To address the switching elements, interconnections or wires, preferably also formed by self-assembly, are needed. The self-assembled wires connecting the conventional electronics to the self-assembled switching elements should be anchored at locations defined by the underlying circuitry and should preferably comprise materials compatible with Si integrated-circuit processing.

Recent reports have shown that catalytic decomposition of a Si-containing gas by a metal, such as Au or Fe, can form long "nanowires"; see, e.g., J. Westwater et al, "Growth of silicon nanowires via gold/silane vapor-liquid-solid reaction", *Journal of Vacuum Science and Technology B*, Vol. 15, pp. 554–557 (May/Jun. 1997) and A. M. Morales et al, "A Laser Ablation Method for the Synthesis of Crystalline Semiconductor Nanowires", *Science*, Vol. 279, pp. 208–211 (Jan. 9, 1998). These studies were based an earlier-developed technique frequently called the vapor-liquid-solid (VLS) mechanism. A liquid alloy droplet containing the metal and Si is located at the tip of the wire and moves along with the growing end of the wire. The wires may either be formed in the gas phase or anchored at one end on a substrate; see, e.g., J. L. Liu et al, "Gas-source MBE growth of freestanding Si nano-wires on Au/Si substrate", *Superlattices and Microstructures*, Vol. 25, pp. 477–479 (1999). However, Au and Fe migrate into Si rapidly and create deep levels, which can degrade devices, such as addressing circuitry and other portions of the system formed by conventional Si integrated-circuit technology.

Titanium and $TiSi_2$ are compatible with integrated-circuit technology and are frequently used in Si circuits to reduce resistance of silicon and polycrystalline-silicon conducting regions. Although Ti forms deep levels in Si, its solubility and diffusion coefficient in Si are low, and the deep levels are not at mid-gap. With suitable handling, Ti is generally accepted in integrated-circuit facilities.

Long, thin "nanowires" of silicon or other materials, such as carbon, can be formed by catalyst-enhanced reaction of gaseous precursors; see, e.g., the abovementioned patent application 09/280,048. The catalysts are often metal-containing nanoparticles either on the surface of a substrate or suspended in the reactor ambient. The nanowires may be useful in electronic or other devices as either connections to an electronic element such as a switch or as electronic elements themselves; see, e.g., the above-mentioned patent applications Ser. Nos. 09/280,225, 09/280,045, 09/280,189, and 09/280,188.

After the nanowires are formed, they are often randomly arranged, either attached at one end to a substrate or with both ends free. Nanowires with both ends free may subsequently be attached at one end to the substrate. A method of aligning the nanowires attached at one end to the substrate is needed to realize potential applications. For many applications, having the wires parallel to each other and possibly parallel to the substrate surface would aid fabrication. In one possible geometry, the wires would serve as one set of electrodes on which switching elements would be formed, and completed by an orthogonal array of counter-electrodes above the switching elements.

DISCLOSURE OF INVENTION

In accordance with the present invention, a method of aligning nanowires on a substrate is provided. First, a plurality of the nanowires is formed on the substrate, then the plurality of nanowires is exposed to a flux of energetic ions. The flux of energetic ions serves to align the nanowires parallel to each other. The flux of energetic ions may also be used to align the nanowires parallel to the substrate surface. The alignment of the nanowires parallel to the substrate may employ essentially the same energy or a higher energy than that used to align the nanowires to each other. Further, the alignment of the nanowires relative to the substrate may occur either in the same step as the alignment of the nanowires relative to each other or subsequently.

BRIEF DESCRIPTION OF THE DRAWINGS

FIG. 2 is an line representation of a plurality of nanowires prior to alignment; and.

BEST MODES FOR CARRYING OUT THE INVENTION

For nanometer scale wires, devices made from redox pairs could be prepared according to the method depicted in FIGS.

Figure 1A:
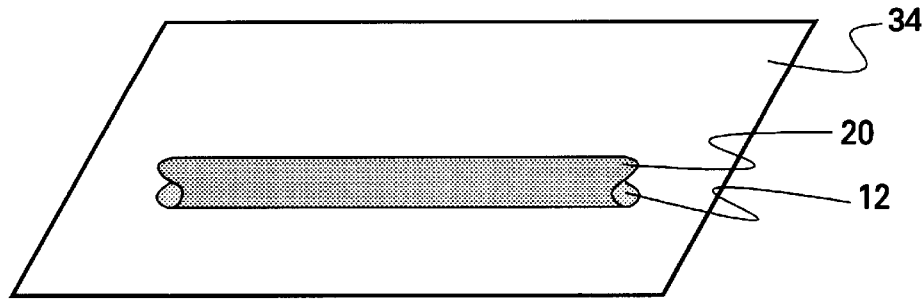
FIGS. 1a–1c represent a series of steps that might be employed to provide a switch using chemically fabricated (nanometer-scale diameter) wires.
Figure 1B:
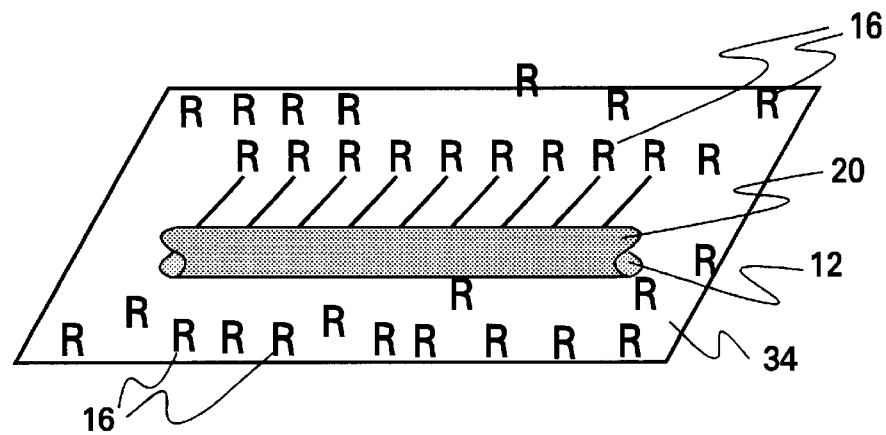
Figure 1C:
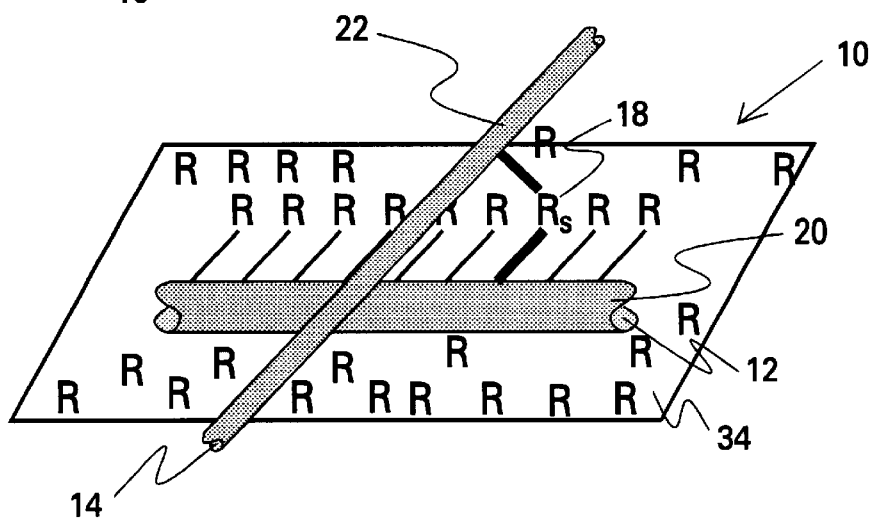

1a–1c, based on above-referenced application Ser. No. 09/280,048. In this case, a metal (i.e., gold) or semiconductor (i.e., silicon) nanowire 12, possibly with an insulating surface layer 20 (for silicon, this is the naturally occurring $SiO_2$; for gold, this can be an alkylthiol molecular layer) is deposited on a substrate 34, as illustrated in FIG. 1a. Second, a redox pair of molecules 16 (labeled R in FIG. 1b) is transferred as either a Langmuir-Blodgett film, or via some other form of deposition such as vacuum sublimation. The redox pair 16 can cover both the wire 12 and the substrate 34. In the last step, either a metal or a semiconductor nanowire 14, possibly with an insulating layer 22, is deposited across the first wire 12. Only those redox pairs 18 that are sandwiched between the two wires 12, 14 are defined, or can function, as molecular switches 10, as illustrated in FIG. 1c. Further details of molecular switches are provided in the above-referenced pending applications; these details are not germane to the method of the present invention.

Silicon nanowires 12 can be grown by the decomposition of a silicon-containing gas, such as silane or dichlorosilane, catalyzed by titanium in Ti—Si islands on a silicon substrate. Gold and iron can serve a similar catalytic function.

Figure 2:
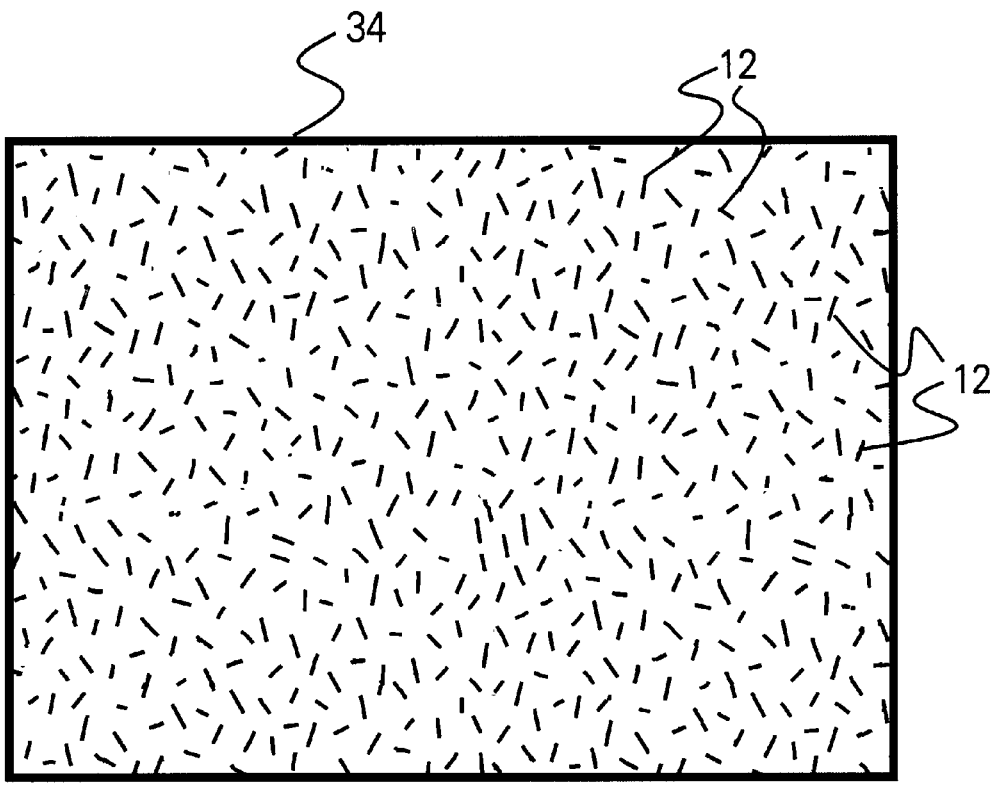

In this case, the nanowires 12 are attached to the silicon substrate 34 on one end. The nanowires 12 are often randomly aligned on the substrate 34 after deposition, as shown in FIG. 2.

The method of the present invention relies on first forming the nanowires on a suitable substrate and then bombarding the nanowires with a suitable aligning species, as mentioned above. The Ti—Si islands are formed by depositing titanium islands on a silicon substrate, possibly followed by annealing at a temperature of about 750° to 950° C. to form $TiSi_2$. The $TiSi_2$ may also be formed by a self-aligned silicide ("salicide") process during transistor fabrication. The composition of the titanium silicide comprises $TiSi_{2-x}$, where either x=0 (stoichiometric) or 0<x<2 (non-stoichiometric).

Figure 3:
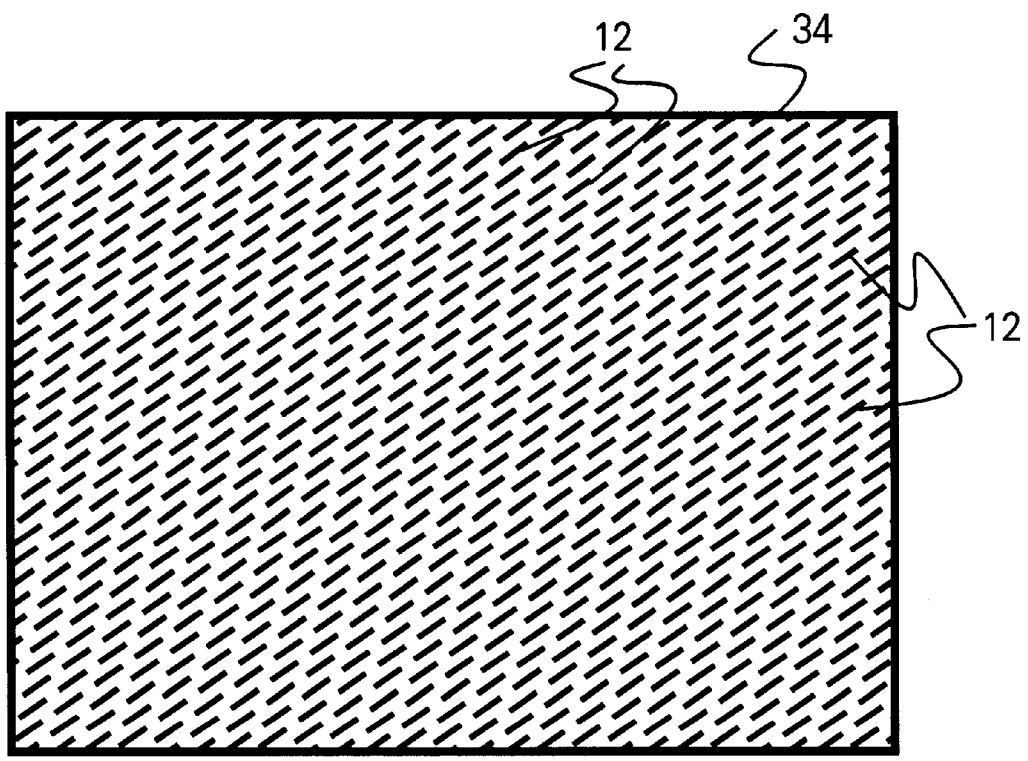
FIG. 3 is a line representation (idealized) of a plurality of nanowires after alignment in accordance with the present invention.

Although the foregoing method was demonstrated with silicon wires formed at Ti—Si islands, the technique is expected to be generally applicable to wires formed of other materials or catalyzed by materials other than Ti. For example, gold and iron are examples of other catalysts used to form nanowires. Other metals used to nucleate Si nanowires, i.e., act as a seed for nanowire growth, include zinc, silver, copper, platinium, palladium, nickel, and manganese. In accordance with the present invention, by exposing the nanowires 12 to a flux of energetic ions, such as argon ions, the nanowires become aligned parallel to each other and may be parallel to the surface of the substrate 34, as shown in FIG. 3. In addition, the nanowires 12 are markedly straighter than before exposure to the ion beam.

A small ion beam may be rastered over the area of interest. A typical argon ion energy is 5 KeV and a typical ion current is 1 microamp. While ion current is one measure, it depends on beam size. Thus, a preferred unit is integrated flux density, which eliminates the need to specify the beam size. An integrated flux density of about $6\times10^{15}$ ions/cm$^2$ is typical and the beam can be rastered over a desired area. (To relate these parameters to typical applications, when used for sputter etching of thermally-grown $SiO_2$, only about 2 nm would be sputter-etched during a similar exposure to the ion beam. Therefore, the method of the present invention should not significantly change the properties of the nanowires).

The alignment is advantageously performed by rastering the ion beam over an area for a period of time. Any reasonable area may be employed in the practice of the present invention, and depends on the equipment capabilities and the current available. The time of rastering ranges from about 2 to 60 sec; 2 sec is the minimum controllable time, while 60 sec is the maximum time for high throughput.

The bombardment is performed at some angle to the substrate surface, typically within the range of about 5 to 45 degrees. A minimum angle of about 5 degrees is required to allow beam positioning. Above the maximum of 45 degrees, the lateral component of the bombardment decreases, and hence a shallower angle, such as 15 degrees, is preferred.

Other inert ions, other than argon, may also be employed as aligning species in the practice of the present invention. Examples of such other inert ions include helium, neon, xenon, and nitrogen. The use of He or Ne may require a higher ion flux than the use of Ar, while the use of Xe may require a lower ion flux. Simple experimentation will readily determine the appropriate ion flux for a given inert ion.

The ion energy is within the range of about 100 eV to 10 KeV for all ions. The integrated flux density is within the range of about $1\times10^{14}$ to $1\times10^{17}$ ions/cm$^2$ for all ions, and about $3\times10^{14}$ to $2\times10^{16}$ ions/cm$^2$ for argon.

The substrate may comprise silicon or another material, such as an oxide. Further, either particles or islands of metal or metal silicides are formed on the substrate.

Without subscribing to any particular theory, the method of the present invention appears to be momentum-dependent, rather than charge-dependent. Thus, while the invention has been demonstrated using positively-charged, inert species, it is anticipated that negatively-charged ions may also be effective in aligning nanowires.

EXAMPLE

1. Nucleation of Silicon Nanowires on Titanium Islands on Silicon Substrates

Ti-containing islands were formed by chemical vapor deposition (CVD) on 150-mm diameter, Si(001) and Si(111) substrates in a commercially available, lamp-heated, single-wafer reactor using $TiCl_4$ in argon as the precursor for the Ti and a $H_2$ ambient. The partial pressure of $TiCl_4$ was 0.06 pa ($4.5\times10^{-4}$ Torr), and the total reactor pressure was 670 pa (5 Torr). Although the Ti deposition process is selective, unpatterned wafers were used in this demonstration. In most cases, only $TiCl_4$ was introduced from the gas phase, with the Si being supplied from the Si substrate. In a few cases, a Si-containing gas ($SiH_4$ or $SiH_2Cl_2$) was added during the deposition of the Ti to minimize consumption of the Si substrate during $TiSi_2$ formation. At the low deposition temperatures of 640° to 670° C. used, the islands are likely to be Ti-rich compared to $TiSi_2$. After deposition, the islands were sometimes annealed at a higher temperature (~920° C.) to reduce their density. On unpatterned wafers, the island density after annealing is determined primarily by the amount of Ti initially deposited, and the island size is determined by the annealing temperature. The island composition after annealing at 920° C. is assumed to be stoichiometric $TiSi_2$.

After Ti deposition and possible annealing, the temperature was set to the silicon deposition temperature (generally 640° or 670° C.), and the island were exposed to a Si-containing gas to form the nanowires. $SiH_4$ and $SiH_2Cl_2$ were used in different experiments, with $SiH_2Cl_2$ having the potential advantage of allowing selective Si deposition. After removing the substrate from the reactor. The surface was examined by scanning electron microscopy and/or atomic-force microscopy. The location of the Ti within the wire was measured by field-emission Auger electron spectroscopy. A schematic of the resulting randomly-oriented silicon nanowires is shown in FIG. 2.

2. Alignment of Silicon Nanowires

The nanowires formed in (1) above were aligned by exposing the silicon nanowires to a flux of energetic argon ions, which was rastered over a 1.5 mm×1.5 mm area for 20 seconds. The argon ion energy was 5 KV and the ion current was 1 μA (i.e., an integrated flux density of about $6\times10^{15}$ ions/cm$^2$). The alignment (idealized) of the silicon nanowires is depicted in FIG. 3.

INDUSTRIAL APPLICABILITY

The method of alignment of nanowires is expected to find use in nanoscale computing and memory circuits.

Thus, there has been disclosed a method of alignment of nanowires, useful in nanoscale computing and memory circuits. It will be evident to those skilled in this art that various changes and modifications of an obvious nature may be made, and all such changes and modifications fall within the scope of the present invention, as defined by the appended claims.

What is claimed is:

1. A method of aligning nanowires on a substrate, comprising:
   (a) forming a plurality of said nanowires on said substrate, said nanowires having two opposed ends, at least one of said ends attached to said substrate; and
   (b) exposing said plurality of nanowires to a flux of energetic species.

2. The method of claim 1 wherein metal-containing nuclei are formed on said substrate and wherein said nanowires are grown by decomposition of a gas catalyzed by said metal in said metal-containing nuclei.

3. The method of claim 2 wherein said metal is selected from the group consisting of titanium, gold, iron, zinc, silver, copper, platinum, palladium, nickel, and manganese.

4. The method of claim 1 wherein said nanowires comprise silicon.

5. The method of claim 1 wherein said substrate comprises silicon.

6. The method of claim 1 wherein energetic species comprise ions of inert gases.

7. The method of claim 6 wherein said inert gases are selected from the group consisting of argon, helium, neon, xenon, and nitrogen.

8. The method of claim 6 wherein said energetic species have an ion energy of 100 eV to 10 KeV.

9. The method of claim 6 wherein said energetic species has an integrated flux density of $1\times10^{14}$ to $1\times10^{17}$ ions/cm$^2$.

10. The method of claim 6 wherein said energetic species is argon ions with an integrated flux density of $3\times10^{14}$ to $2\times10^{16}$ ions/cm$^2$.

11. The method of claim 10 wherein said ion energy is about 5 KeV and said integrated flux density is about $6\times10^{15}$ ions/cm$^2$.

12. The method of claim 6 wherein said plurality of nanowires is exposed to said flux of ions for a period of time within a range of 2 to 60 seconds.

13. The method of claim 12 wherein said time is about 20 seconds.

14. The method of claim 1 wherein said flux of energetic species is rastered over an area on said substrate.

15. The method of claim 1 wherein said nanowires are attached to said substrate during formation of said nanowires on said substrate.

16. The method of claim 1 wherein said nanowires are attached to said substrate following formation of said nanowires and prior to said exposing.

17. A plurality of nanowires aligned by the method of claim 1.

* * * * *